United States Patent
Jun et al.

(10) Patent No.: US 8,013,341 B2
(45) Date of Patent: Sep. 6, 2011

(54) ORGANIC LIGHT-EMITTING DISPLAY DEVICE

(75) Inventors: Woo-Sik Jun, Suwon-si (KR); Hee-Chul Jeon, Suwon-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 0 days.

(21) Appl. No.: 12/941,253

(22) Filed: Nov. 8, 2010

(65) Prior Publication Data

US 2011/0049502 A1    Mar. 3, 2011

Related U.S. Application Data

(62) Division of application No. 12/051,150, filed on Mar. 19, 2008, now Pat. No. 7,851,245.

(30) Foreign Application Priority Data

Aug. 8, 2007   (KR) .................................. 2007-79707

(51) Int. Cl.
*H01L 29/04* (2006.01)
(52) U.S. Cl. ....... 257/72; 257/40; 257/59; 257/E29.117; 257/E29.273
(58) Field of Classification Search ............ 257/40, 257/59, 72, E29.117, E29.273
See application file for complete search history.

(56) References Cited

U.S. PATENT DOCUMENTS

| | | |
|---|---|---|
| 7,599,014 B2 | 10/2009 | Shih |
| 2005/0247946 A1 | 11/2005 | Shin |
| 2005/0258426 A1 | 11/2005 | Shin |
| 2006/0220542 A1 | 10/2006 | Suh et al. |
| 2007/0108889 A1 | 5/2007 | Kim |

FOREIGN PATENT DOCUMENTS

| | | |
|---|---|---|
| JP | 2003-241689 | 8/2003 |
| KR | 2004-37889 | 5/2004 |

OTHER PUBLICATIONS

Registration Determination Certificate issued in corresponding Korean Patent Application No. 2007-79707 dated Oct. 31, 2008.
U.S. Appl. No. 12/051,150, filed Mar. 19, 2008, Woo-Sik Jun, Samsung Mobile Display Co., Ltd.

*Primary Examiner* — Andy Huynh
(74) *Attorney, Agent, or Firm* — H.C. Park & Associates, PLC

(57) ABSTRACT

An organic light-emitting display device includes a substrate; a gate electrode disposed on the substrate, the gate electrode including a first portion of a metal oxide layer and a metal layer; a pixel electrode disposed on the substrate and including a second portion of the metal oxide layer; a gate insulating layer covering the gate electrode; a semiconductor layer disposed on the gate insulating layer and including a channel region, and first and second regions disposed outside the channel region; a first electrode connected to the first region; a second electrode connected to the second region and the pixel electrode; an ohmic contact layer disposed between the first region and the first electrode and between the second region and the second electrode; a pixel defining layer including an opening exposing the pixel electrode; an organic light-emitting layer disposed on the pixel electrode; and an opposite electrode covering the organic light-emitting layer.

8 Claims, 8 Drawing Sheets

ORGANIC LIGHT-EMITTING DISPLAY DEVICE

CROSS-REFERENCE TO RELATED APPLICATIONS

This application is a divisional of U.S. patent application Ser. No. 12/051,150 filed Mar. 19, 2008, now U.S. Pat. No. 7,851,245, which claims the benefit of Korean Application No. 10-2007-0079707, filed Aug. 8, 2007, in the Korean Intellectual Property Office, the disclosures of which are incorporated herein by reference.

BACKGROUND OF THE INVENTION

1. Field of the Invention

Aspects of the present invention relates to an organic light-emitting display device and a method of manufacturing an organic light-emitting display device. More particularly, aspects of the present invention relate to an organic light-emitting display device including a bottom gate type thin film transistor that can be easily manufactured, and a method of manufacturing an organic light-emitting display device.

2. Description of the Related Art

Thin film transistors have been used as switching or driving devices of flat panel displays such as liquid crystal displays or organic light-emitting display devices. Thin film transistors can be classified into top gate types and bottom gate types according to the position of the gate electrode. Top gate type thin film transistors are widely used in flat panel displays including organic light-emitting display devices.

Organic light-emitting display devices are self-emitting display devices that include an organic light-emitting layer between a pixel electrode and an opposite electrode. Organic light-emitting display devices have advantages such as a wide viewing angle, good contrast, and rapid response speed, and thus, have been highlighted as next generation display devices.

FIG. 1 is a schematic sectional view illustrating an organic light-emitting display device including a conventional top gate type thin film transistor. Referring to FIG. 1, the organic light-emitting display device includes, on a substrate 10, a buffer layer 11, a semiconductor layer 21, an inter-insulating layer 12, a gate electrode 22, a gate insulating layer 13, source and drain electrodes 23 and 24, a passivation layer 14, a pixel defining layer 15, a pixel electrode 27, an organic light-emitting layer 28, and an opposite electrode 29.

In order to manufacture the organic light-emitting display device, first, the buffer layer 11 and an amorphous silicon layer are sequentially deposited on the substrate 10, the amorphous silicon layer is crystallized into a polycrystalline silicon layer, and the polycrystalline silicon layer is patterned in a predetermined shape using a first mask. Then, the patterned polycrystalline silicon layer is ionically doped using a second mask so that source and drain regions are defined in the patterned polycrystalline silicon layer to thereby form the semiconductor layer 21.

Next, the inter-insulating layer 12 and a conductive material forming the gate electrode 22 are deposited on the buffer layer 11 and the semiconductor layer 21, and the conductive material is patterned in a predetermined shape using a third mask to form the gate electrode 22.

After forming the gate electrode 22, the gate insulating layer 13 is deposited on the gate electrode 22. Then, contact holes 25 are formed in the inter-insulating layer 12 and the gate insulating layer 13 using a fourth mask in order to electrically connect the source and drain electrodes 23 and 24 to the semiconductor layer 21.

After forming the contact holes 25, a source/drain electrode material is deposited on the gate insulating layer 13 and patterned in a predetermined shape using a fifth mask to form the source and drain electrodes 23 and 24.

After forming the source and drain electrodes 23 and 24, the passivation layer 14 is deposited on the source and drain electrodes 23 and 24 and the gate insulating layer 13, and a via hole 26 is formed in the passivation layer 14 using a sixth mask in order to electrically connect one of the source and drain electrodes 23 and 24 to the pixel electrode 27.

After forming the via hole 26, a conductive material is deposited on the passivation layer 14 and patterned using a seventh mask to form the pixel electrode 27.

After forming the pixel electrode 27, the pixel defining layer 15 is deposited on the passivation layer 14 and the pixel electrode 27, and patterned using an eighth mask so that the pixel electrode 27 is partially exposed. When a spacer (not shown) is further disposed on the pixel defining layer 15, the spacer is deposited and patterned using another mask (ninth mask).

The organic light-emitting layer 28 is deposited on an exposed portion of the pixel electrode 27 using a shadow mask or an open mask, and the opposite electrode 29 is then deposited on the organic light-emitting layer 28 using an open mask.

As described above, when manufacturing an organic light-emitting display device including a conventional top gate type thin film transistor, numerous mask processes are required for patterning, and each mask process involves a series of procedures including providing a photoresist coating, exposing the layer to be patterned to light, and developing the exposed layer. Thus, the manufacturing method is complicated, thus increasing manufacturing costs.

SUMMARY OF THE INVENTION

Aspects of the present invention provide an organic light-emitting display device capable of reducing the number of mask patterning processes and a method of manufacturing the same.

According to an embodiment of the present invention, there is provided an organic light-emitting display device including: a substrate; a gate electrode disposed on the substrate, the gate electrode including a first portion of a metal oxide layer and a metal layer; a pixel electrode disposed on the substrate so as to be insulated from the gate electrode, the pixel electrode including a second portion of the metal oxide layer; a gate insulating layer disposed on the substrate to cover the gate electrode; a semiconductor layer disposed on the gate insulating layer, the semiconductor layer including a channel region corresponding to the gate electrode, and first and second regions disposed outside the channel region; a first electrode connected to the first region of the semiconductor layer; a second electrode connected to the second region of the semiconductor layer and the pixel electrode; an ohmic contact layer disposed between the first region of the semiconductor layer and the first electrode and between the second region of the semiconductor layer and the second electrode; a pixel defining layer disposed on the substrate to cover the first electrode, the second electrode, the semiconductor layer, and the pixel electrode, the pixel defining layer including an opening through which the pixel electrode is partially exposed; an organic light-emitting layer disposed on a portion of the pixel electrode exposed through the opening; and an opposite electrode covering the organic light-emitting layer.

In the gate electrode according to an aspect of the present invention, the metal oxide layer and the metal layer may be sequentially stacked on the substrate.

According to an aspect of the present invention, the pixel electrode may further include a metal layer.

In each of the gate electrode and the pixel electrode according to an aspect of the present invention, the metal layer and the metal oxide layer may be sequentially stacked on the substrate.

According to an aspect of the present invention, the metal oxide layer may include at least one metal oxide material selected from the group consisting of ITO, IZO, ZnO, and $In_2O_3$.

According to an aspect of the present invention, the metal layer may include at least one metal material selected from the group consisting of Mo, Cr, Ti, Ag, Mg, Al, Pt, Pd, Au, Ni, Nd, Ir, Li, Ca, and compounds thereof.

According to an aspect of the present invention, the semiconductor layer may include a polycrystalline silicon layer.

Ends of the gate insulating layer, the semiconductor layer, and the ohmic contact layer according to an aspect of the present invention may have the same patterns.

According to an aspect of the present invention, the organic light-emitting display device may further include a buffer layer on the substrate.

According to another embodiment of the present invention, there is provided a method of manufacturing an organic light-emitting display device, the method including: depositing a material for forming a gate electrode and a pixel electrode on a substrate and patterning the material to form the gate electrode and the pixel electrode so that the gate electrode and the pixel electrode are insulated from each other; depositing a gate insulating material on the gate electrode and the pixel electrode; depositing an amorphous silicon layer on the gate insulating material; crystallizing the amorphous silicon layer to form a polycrystalline silicon layer; depositing an ohmic contact material on the polycrystalline silicon layer; patterning the gate insulating material, the polycrystalline silicon layer, and the ohmic contact material so that the pixel electrode is exposed to thereby form a gate insulating layer, a semiconductor layer, and an ohmic contact layer which are separated from the pixel electrode; depositing a conductive material on the substrate, the ohmic contact layer, and the pixel electrode, and patterning the conductive material so that the ohmic contact layer corresponding to the gate electrode is exposed to thereby form a first electrode which is connected to the ohmic contact layer and a second electrode which is separated from the first electrode and which is connected to the ohmic contact layer and the pixel electrode; etching an exposed portion of the ohmic contact layer; depositing a pixel defining layer forming material on the substrate, the first and second electrodes, the semiconductor layer, and the pixel electrode and patterning the pixel defining layer forming material so that the pixel electrode is exposed to thereby form a pixel defining layer; and forming an organic light-emitting layer and an opposite electrode on the pixel electrode.

In the formation of the gate electrode and the pixel electrode according to an aspect of the present invention, a metal oxide layer and a metal layer may be sequentially deposited on the substrate and patterned to form the gate electrode and the pixel electrode, each of which includes the metal oxide layer and the metal layer.

In the formation of the gate insulating layer, the semiconductor layer, and the ohmic contact layer according to an aspect of the present invention, the gate insulating material, the polycrystalline silicon layer, and the ohmic contact material may be patterned so that the metal oxide layer of the pixel electrode is exposed.

In the formation of the gate insulating layer, the semiconductor layer, and the ohmic contact layer according to an aspect of the present invention, the gate insulating material, the polycrystalline silicon layer, and the ohmic contact material may be patterned at the same time using a half-tone mask.

In the formation of the gate electrode and the pixel electrode according to an aspect of the present invention, a metal layer and a metal oxide layer may be sequentially deposited on the substrate and patterned to form the gate electrode and the pixel electrode, each of which includes the metal layer and the metal oxide layer.

In the formation of the gate insulating layer, the semiconductor layer, and the ohmic contact layer according to an aspect of the present invention, the gate insulating material, the polycrystalline silicon layer, and the ohmic contact material may be patterned so that the metal oxide layer of the pixel electrode is exposed.

In the formation of the gate insulating layer, the semiconductor layer, and the ohmic contact layer according to an aspect of the present invention, the gate insulating material, the polycrystalline silicon layer, and the ohmic contact material may be patterned so that ends of the gate insulating layer, the semiconductor layer, and the ohmic contact layer have the same patterns.

According to an aspect of the present invention, the method may further include forming a buffer layer on the substrate.

According to another embodiment of the present invention, there is provided a method of manufacturing an organic light-emitting display device comprising simultaneously forming a gate electrode and a pixel electrode by depositing a material for forming the gate electrode and the pixel electrode on a substrate and patterning the material to form the gate electrode and the pixel electrode so that the gate electrode and the pixel electrode are insulated from each other.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
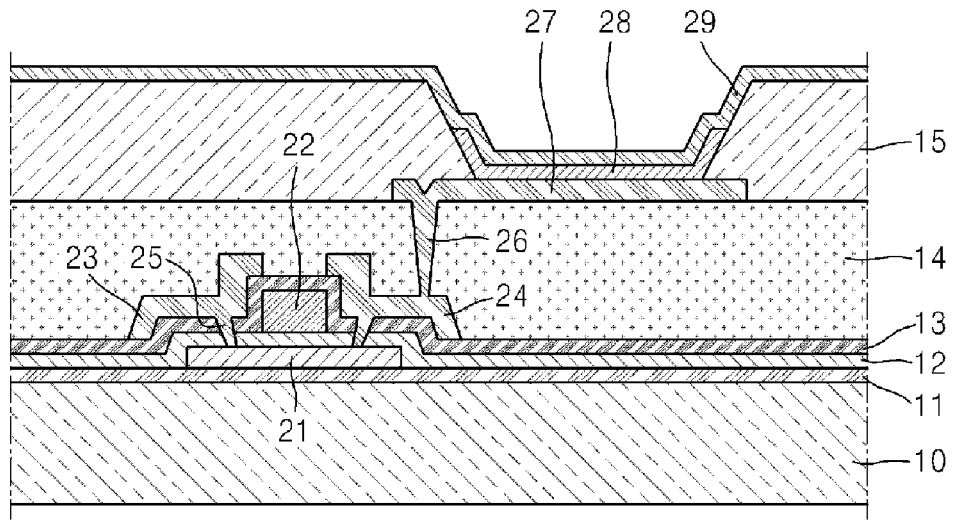
FIG. 1 is a schematic sectional view illustrating an organic light-emitting display device including a conventional top gate type thin film transistor.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
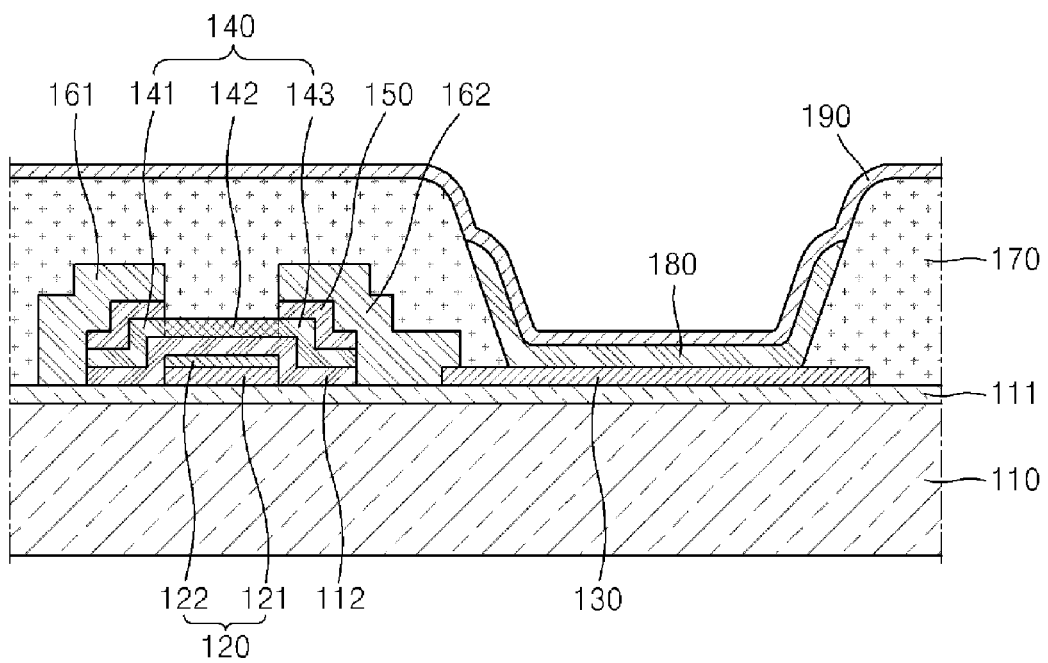
FIG. 2 is a schematic sectional view illustrating an organic light-emitting display device according to an embodiment of the present invention.

FIG. 2 is a schematic sectional view illustrating an organic light-emitting display device that includes a bottom gate type thin film transistor according to an embodiment of the present invention. FIGS. 3 through 8 are schematic sectional views sequentially illustrating a method of manufacturing the organic light-emitting display device shown in FIG. 2.

Referring to FIG. 2, the organic light-emitting display device according to the current embodiment of the present invention includes a substrate 110, a buffer layer 111, a gate electrode 120, a pixel electrode 130, a gate insulating layer 112, a semiconductor layer 140, an ohmic contact layer 150, first and second electrodes 161 and 162, a pixel defining layer 170, an organic light-emitting layer 180, and an opposite electrode 190.

The substrate 110 may be formed of a glass material including $SiO_2$ as a main component, but the present invention is not limited thereto. The substrate 110 may also be formed of various other materials such as, for example, a plastic material. However, since the organic light-emitting display device according to the current embodiment of the present invention is a bottom emission type organic light-emitting display device in which images are displayed in the direction of the substrate 110, as will be described later, the substrate 110 should be formed of a transparent material.

The buffer layer 111 may be disposed on an upper surface of the substrate 110 to make the substrate 110 smooth and to prevent the penetration of impurity elements. The buffer layer 111 may be deposited by various deposition methods such as plasma enhanced chemical vapor deposition (PECVD), atmospheric pressure chemical vapor deposition (APCVD), low pressure chemical vapor deposition (LPCVD), and enhanced reflectivity coating (ERC). It is to be understood that the buffer layer is not required in every instance.

Where it is described herein that a first layer is "formed on," "deposited on" or "disposed on" a second layer, it is to be understood that the first layer may be formed directly on the second layer or that there may be an intervening layer between the first layer and the second layer.

Figure 3:
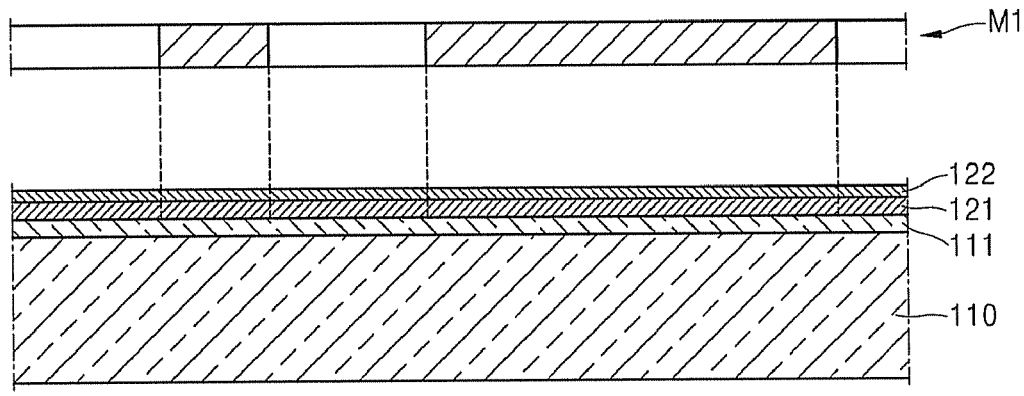
FIGS. 3 through 8 are schematic sectional views illustrating a method of manufacturing the organic light-emitting display device shown in FIG. 2.
Figure 4:
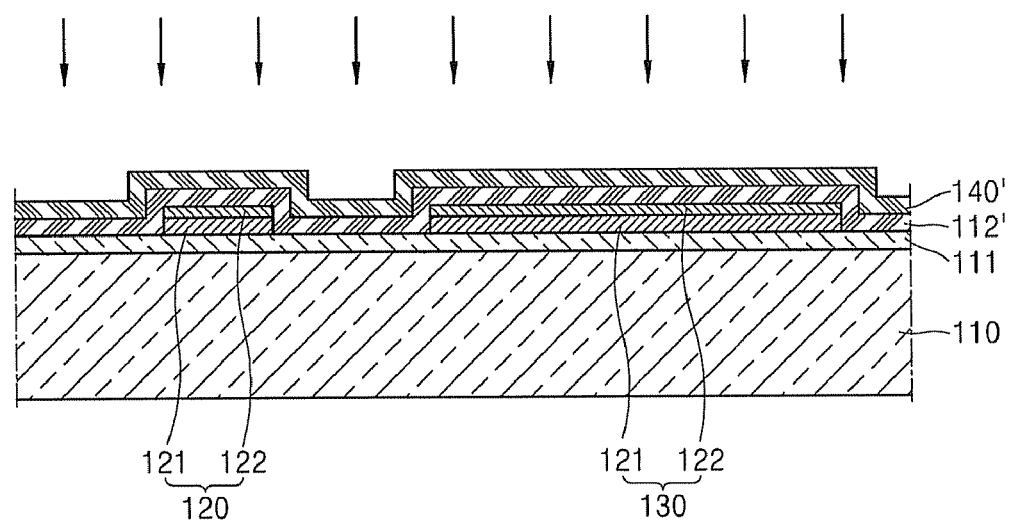

Referring to FIG. 3, a metal oxide layer 121 including a metal oxide material such as ITO, IZO, ZnO, or $In_2O_3$ is deposited on the buffer layer 111, and a metal layer 122 including Ag, Mg, Al, Pt, Pd, Au, Ni, Nd, Ir, Cr, Li, Ca, Mo, Ti, or a compound thereof is deposited on the metal oxide layer 121. The metal oxide layer 121 and the metal layer 122 are patterned in predetermined shapes using a patterned mask M1 to form the gate electrode 120 and the pixel electrode 130, as shown in FIG. 4. The gate electrode 120 is connected to a gate line (not shown) to apply an "on/off" signal to the thin film transistor. Hereinafter, the patterning of the metal oxide layer 121 and the metal layer 122 using the mask M1 will be described in more detail.

First, the metal oxide layer 121 and the metal layer 122 are sequentially deposited on the buffer layer 111, and a photoresistor is coated on the entire surface of the resultant structure. The photoresistor is patterned in a predetermined shape using a conventional photolithography process. That is, after the photoresistor is exposed to light through the patterned mask M1, developed, and baked, the metal oxide layer 121 and the metal layer 122 are etched at the same time according to the defined pattern. The etching may be wet etching or dry etching. The dry etching may include plasma etching, reactive ion etching (RIE), reactive sputter etching, reactive ion-beam milling, etc. In a mask patterning process, the above-described procedure is repeated with respect to other layers, as described below. Thus, for patterning processes as will be mentioned later, a detailed description thereof will be omitted.

Referring to FIG. 4, a gate insulating material 112' is deposited on the gate electrode 120 and the pixel electrode 130 formed by the above-described mask process. For the gate insulating material 112', an inorganic insulating material such as $SiN_x$ or $SiO_x$ may be deposited by a deposition method such as PECVD, APCVD, LPCVD, or ERC.

Figure 6:
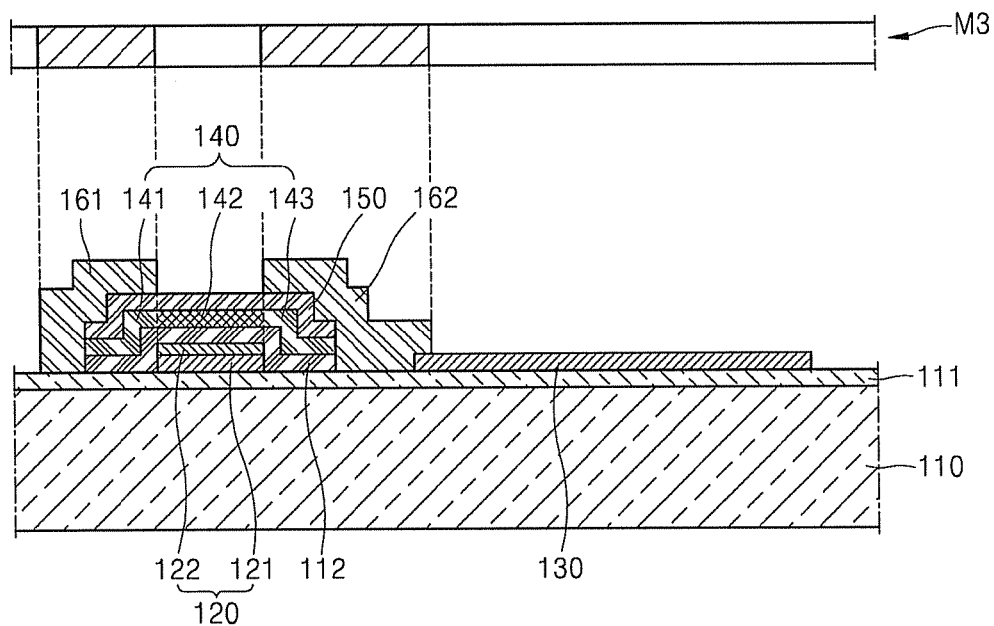

A polycrystalline silicon layer 140' is formed on the gate insulating material 112'. For this, first, an amorphous silicon layer is deposited and crystallized. The amorphous silicon layer can be crystallized to the polycrystalline silicon layer 140' by various methods such as RTA (Rapid Thermal Annealing), SPC (Solid Phase Crystallization), ELA (Excimer Laser Annealing), MIC (Metal Induced Crystallization), MILC (Metal Induced Lateral Crystallization), or SLS (Sequential Lateral Solidification). The polycrystalline silicon layer 140' is patterned to form a semiconductor layer 140 as will be described later with reference to FIG. 6. As shown in FIG. 6, the semiconductor layer 140 includes a channel region 142, which corresponds to the gate electrode 120 and which forms an electron passage, and first and second regions 141 and 143, which are disposed outside the channel region 142 and which are connected to first and second electrodes 161 and 162 via an ohmic contact layer 150.

Figure 5:
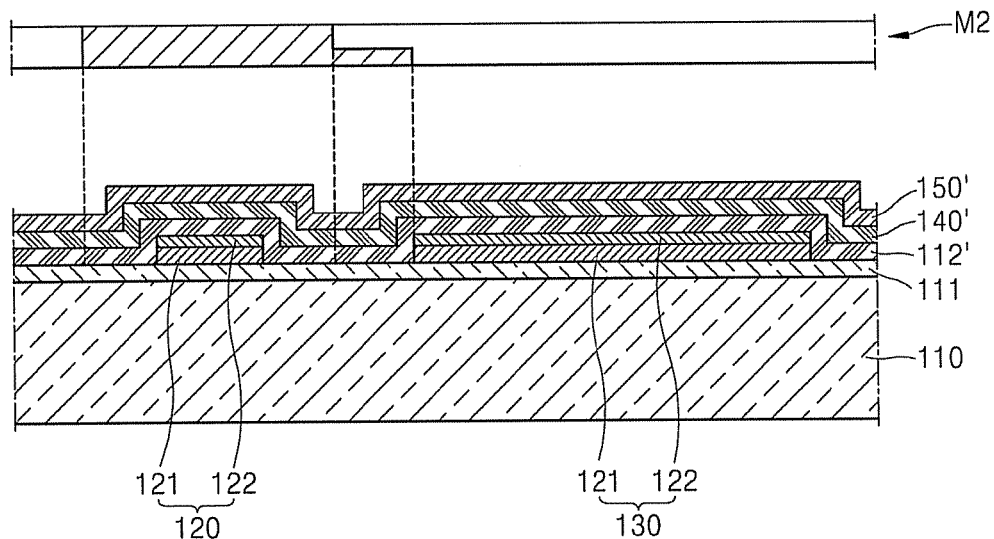

Referring to FIG. 5, an ohmic contact material 150' is deposited on the polycrystalline silicon layer 140'. For the ohmic contact material 150', $N^+$ or $P^+$ doped silicon may be deposited on the polycrystalline silicon layer 140' using CVD or the like.

After depositing the ohmic contact material 150', the gate insulating material 112', the polycrystalline silicon layer 140', and the ohmic contact material 150', which are sequentially formed on the gate electrode 120, are patterned in the same shapes using a mask M2. Portions of the gate insulating material 112', the polycrystalline silicon layer 140', the ohmic contact material 150', and the metal layer 122 that correspond to the pixel electrode 130 are removed, whereas a portion of the metal oxide layer 121 that corresponds to the pixel electrode 130 is left. Portions of the gate insulating material 112', the polycrystalline silicon layer 140', and the ohmic contact material 150' that are deposited on the buffer layer 111 between the gate electrode 120 and the pixel electrode 130, are removed. As described above, since regions corresponding to the gate electrode 120, regions corresponding to the pixel electrode 130, and regions between the gate electrode 120 and the pixel electrode 130 are etched in different manners, the mask M2 used in the patterning may be a half-tone mask including a light-transmitting portion, a light-blocking portion, and a translucent portion.

Referring to FIG. 6, a conductive material to form source and drain electrodes is deposited on the substrate 110, the ohmic contact layer 150, and the pixel electrode 130 and is then patterned using a mask M3 to form the first and second electrodes 161 and 162 serving as source and drain electrodes.

The first electrode 161 is connected to the first region 141 of the semiconductor layer 140 via the ohmic contact layer 150. The second electrode 162 is connected to the second region 143 of the semiconductor layer 140 and the pixel electrode 130 via the ohmic contact layer 150. Here, the first electrode 161 and the first region 141 serve as a source electrode and a source region, respectively, and the second electrode 162 and the second region 143 serve as a drain electrode and a drain region, respectively. Of course, the first electrode 161 and the first region 141 may serve as a drain electrode and a drain region, respectively, and the second electrode 162 and the second region 143 may serve as a source electrode and a source region, respectively. The first and second electrodes 161 and 162 may be single metal layers formed of aluminum (Al) or copper (Cu) or dual metal layers in which a metal such as molybdenum (Mo), uranium (W), chromium (Cr), or platinum (Pt) is stacked on an aluminum (Al) layer. In addition, the first and second electrodes 161 and 162 may be formed of various materials. Although not shown, the first and second electrodes 161 and 162 are connected to data lines (not shown) applying data signals.

Figure 7:
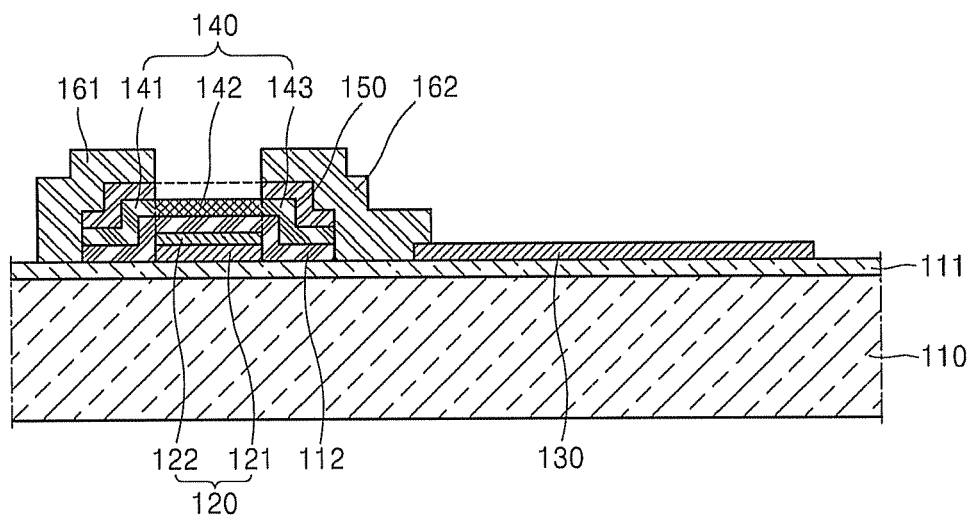

Referring to FIG. 7, after forming the first and second electrodes 161 and 162, the portion of the ohmic contact layer 150 exposed between the first and second electrodes 161 and 162 is removed by etching. As a non-limiting example, the etching may be dry etching such as, for example, plasma etching, reactive ion etching (RIE), reactive sputter etching, reactive ion-beam milling, etc.

Figure 8:
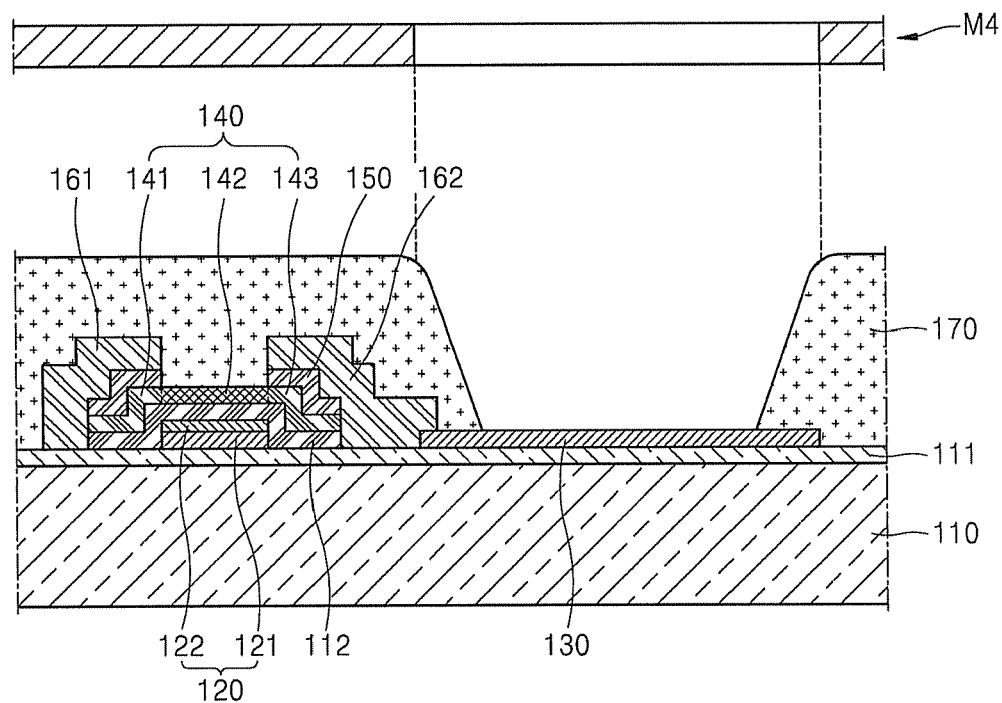

Referring to FIG. 8, a material to form a pixel defining layer (PDL) 170 is deposited on the resultant structure of FIG. 7. As a non-limiting example, a polyimide may be used as the material for forming the pixel defining layer 170. The pixel defining layer 170 defines an emission area, and further, provides an increased distance between edges of the pixel electrode 130 and an opposite electrode (see 190 of FIG. 2) to prevent the concentration of electric field at the edges of the pixel electrode 130, thereby preventing a short-circuit between the pixel electrode 130 and the opposite electrode 190.

Referring again to FIG. 2, together with FIG. 8, the pixel defining layer 170 is patterned using a mask M4, and the organic light-emitting layer 180 is formed on the resultant structure. The organic light-emitting layer 180 emits light when the pixel electrode 130 and the opposite electrode 190 are electrically driven. The organic light-emitting layer 180 may be formed of a low molecular weight or polymer organic material. When the organic light-emitting layer 180 is formed of a low molecular weight organic material, a hole transport layer and a hole injection layer are disposed on a surface of the organic light-emitting layer 180 facing the pixel electrode 130, and an electron transport layer and an electron injection layer are disposed on a surface of the organic light-emitting layer 180 facing the opposite electrode 190. If necessary, various other layers may be disposed between the pixel electrode 130 and the opposite electrode 190. Non-limiting examples of the low molecular weight organic material include copper phthalocyanine (CuPc), N,N'-di(naphthalene-1-yl)-N,N'-diphenyl-benzidine (NPB), tris-8-hydroxyquinoline aluminum (Alq3), etc.

When the organic light-emitting layer 180 is formed of a polymer organic material, only a hole transport layer (HTL) may be disposed on a surface of the organic light-emitting layer 180 facing the pixel electrode 130. Here, the hole transport layer may be formed on the pixel electrode 130 by inkjet printing or spin coating using polyethylene dihydroxythiophene (PEDOT: poly-(2,4)-ethylene-dihydroxy thiophene) or polyaniline (PANI), and the organic light-emitting layer 180 may be color-patterned by a conventional method, e.g., inkjet printing, spin coating, or laser-induced thermal transfer, using PPV, soluble PPV, cyano-PPV, polyfluorene, or the like.

The opposite electrode 190 serving as a common electrode is deposited on the organic light-emitting layer 180. In the organic light-emitting display device according to the current embodiment of the present invention, the pixel electrode 130 is an anode and the opposite electrode 190 is a cathode. Alternatively, the pixel electrode 130 may be a cathode and the opposite electrode 190 may be an anode. As described above, in a bottom emission type organic light-emitting display device in which images are displayed in the direction of the substrate 110, the pixel electrode 130 serves as a transparent electrode and the opposite electrode 190 serves as a reflective electrode. The reflective electrode may be formed of a metal with a low work function, i.e., Ag, Mg, Al, Pt, Pd, Au, Ni, Nd, Ir, Cr, Li, Ca, or the like.

A sealing member (not shown) and a hydroscopic agent (not shown) may be further provided on the opposite electrode 190 in order to protect the organic light-emitting layer 180 from external moisture or oxygen.

In the above-described organic light-emitting display device according to the current embodiment of the present invention, a metal oxide layer and a metal layer are sequentially deposited and patterned to simultaneously form a gate electrode and a pixel electrode, and a metal layer of the pixel electrode is removed simultaneously with patterning a semiconductor layer, thus significantly reducing the number of mask processes used in forming the organic light-emitting display device. In addition, since the organic light-emitting display device of the current embodiment of the present invention is a bottom emission type organic light-emitting display device, a problem of reduction in display quality due to dark spots formed by an IR drop across an opposite electrode (a cathode) used as a common electrode in a middle- or large-sized organic light-emitting display device does not occur.

Hereinafter, an organic light-emitting display device according to another embodiment of the present invention will be described in more detail with reference to FIGS. 9 through 15. A detailed description of the same elements as in the previous embodiment will be omitted.

Figure 9:
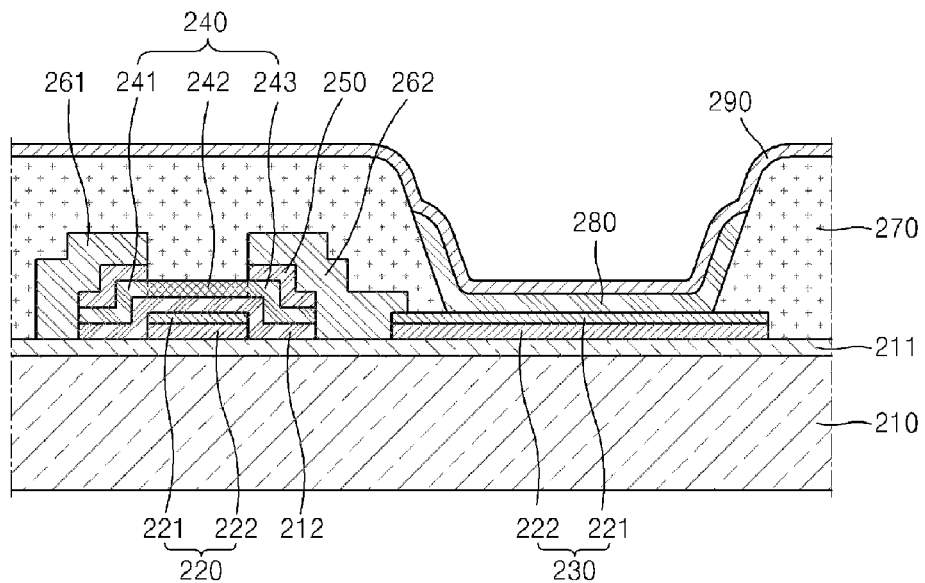
FIG. 9 is a schematic sectional view illustrating an organic light-emitting display device according to another embodiment of the present invention.

FIG. 9 is a schematic sectional view illustrating an organic light-emitting display device including a bottom gate type thin film transistor according to another embodiment of the present invention, and FIGS. 10 through 15 are schematic sectional views illustrating a method of manufacturing the organic light-emitting display device shown in FIG. 9.

Referring to FIG. 9, the organic light-emitting display device according to the current embodiment of the present invention includes a substrate 210, a buffer layer 211, a gate electrode 220, a pixel electrode 230, a gate insulating layer 212, a semiconductor layer 240, an ohmic contact layer 250, first and second electrodes 261 and 262, a pixel defining layer 270, an organic light-emitting layer 280, and an opposite electrode 290.

The substrate 210 may be formed of a glass material including $SiO_2$ as a main component, but the present invention is not limited thereto. The substrate 210 may be formed of various other materials such as, for example a plastic material. The buffer layer 211 may be disposed on an upper surface of the substrate 210 to make the substrate 210 smooth and to prevent the penetration of impurity elements. It is to be understood that the buffer layer is not required in every instance.

Figure 10:
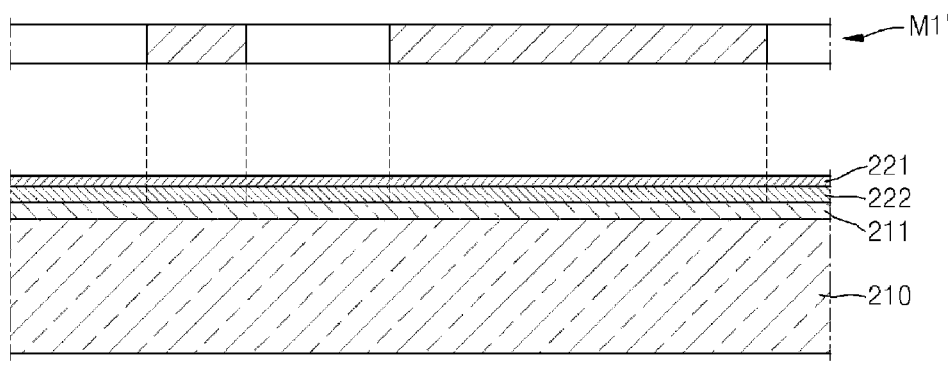
FIGS. 10 through 15 are schematic sectional views illustrating a method of manufacturing the organic light-emitting display device shown in FIG. 9.
Figure 11:
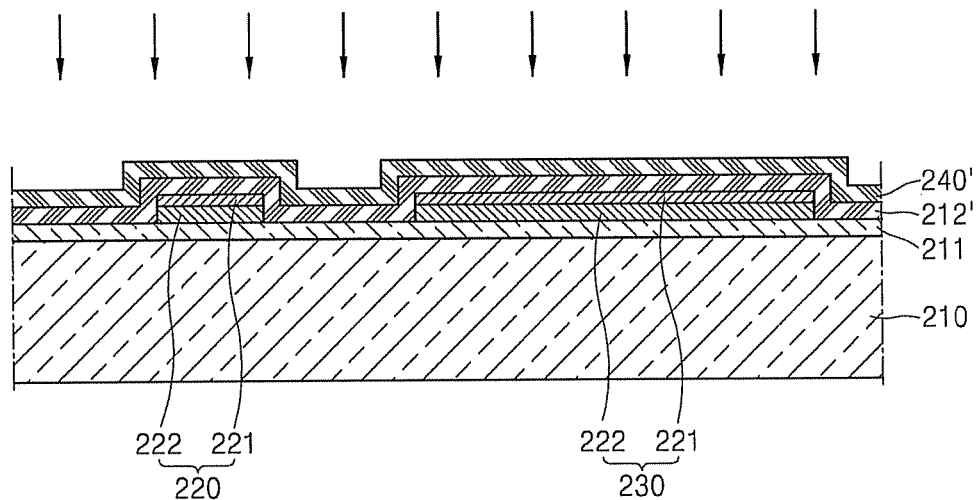

Referring to FIG. 10, a metal layer 222 including Ag, Mg, Al, Pt, Pd, Au, Ni, Nd, Ir, Cr, Li, Ca, Mo, Ti, or a compound thereof is deposited on the buffer layer 211, and a metal oxide layer 221 including a metal oxide material such as ITO, IZO, ZnO, or $In_2O_3$ is deposited on the metal layer 222. The metal layer 222 and the metal oxide layer 221 are patterned in predetermined shapes using a patterned mask M1' to form the gate electrode 220 and the pixel electrode 230 as shown in FIG. 11. The gate electrode 220 is connected to a gate line (not shown) applying an "on/off" signal to a thin film transistor.

Figure 13:
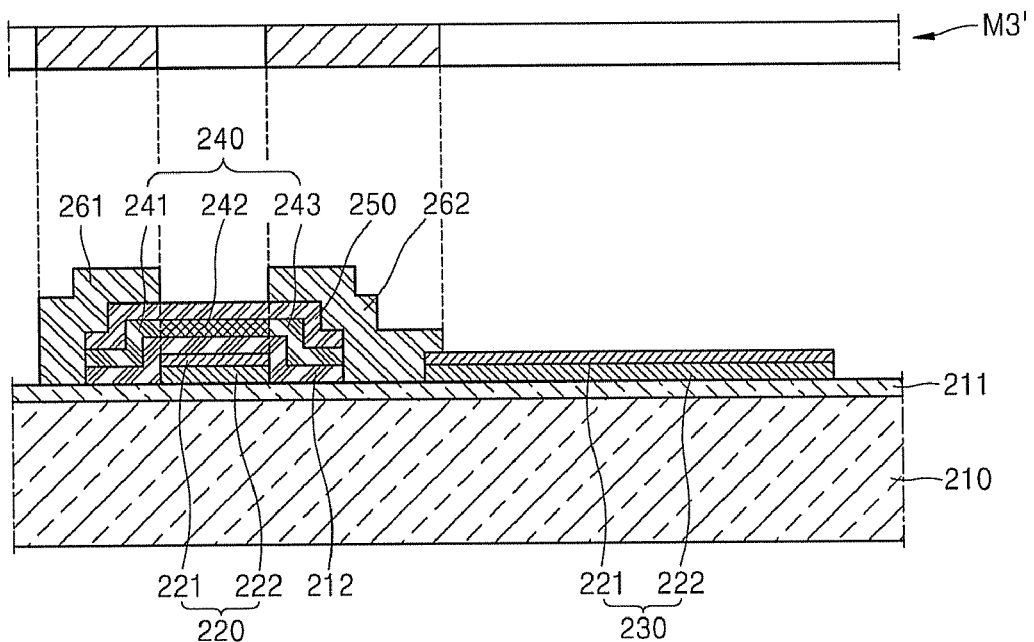

Referring to FIG. 11, a gate insulating material 212' is deposited on the gate electrode 220 and the pixel electrode 230 formed by the above-described mask process. An amorphous silicon is deposited on the gate insulating material 212' and crystallized by the above-described crystallization of amorphous silicon to form a polycrystalline silicon layer 240'. The polycrystalline silicon layer 240' is patterned to form a semiconductor layer 240 as will be described later with reference to FIG. 13. As shown in FIG. 13, the semiconductor layer 240 includes a channel region 242, which corresponds to the gate electrode 220 and which forms an electron passage, and first and second regions 241 and 243, which are disposed outside the channel region 242 and which are connected to first and second electrodes 261 and 262 via an ohmic contact layer 250.

Figure 12:
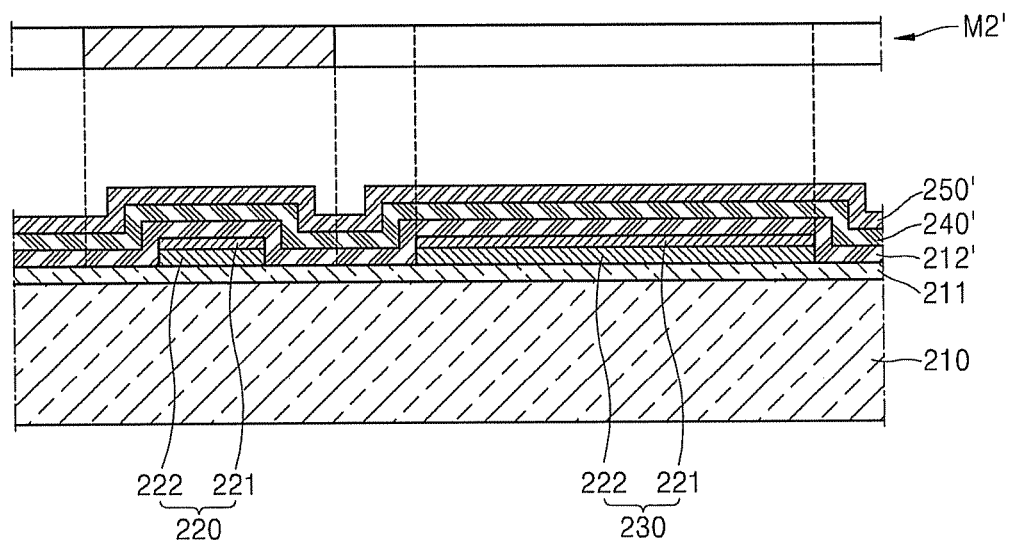

Referring to FIG. 12, an ohmic contact material 250' including $N^+$ or $P^+$ doped silicon is deposited on the polycrystalline silicon layer 240' by CVD or the like. After depositing the ohmic contact material 250', the gate insulating material 212', the polycrystalline silicon layer 240', and the ohmic contact material 250', which are sequentially stacked on the gate electrode 220, are patterned in the same shapes using a mask M2'. At this time, the patterning of the region of the gate electrode 220 is performed dividedly and separately from the patterning of the region of the pixel electrode 230.

In the previously described embodiment of the present invention, the metal layer deposited in forming the pixel electrode is removed, but the metal oxide layer is left. In the current embodiment of the present invention, both the metal layer 222 and the metal oxide layer 221 of the pixel electrode 230 are left, and portions of the gate insulating material 212', the polycrystalline silicon layer 240', and the ohmic contact material 250' that are stacked on the metal layer 222 and the metal oxide layer 221 are removed. Thus, in the previously described embodiment of the present invention, a half-tone mask including a light-transmitting portion, a light-blocking portion, and a translucent portion is used. However, in the current embodiment of the present invention, it is not necessary to use a half-tone mask. That is, the metal oxide layer 221 of the pixel electrode 230 is exposed by photolithography using the mask M2' including a light-transmitting portion and a light-blocking portion, development, and etching.

In the current embodiment of the present invention, with respect to the pixel electrode 230, the metal layer 222 is deposited on the substrate 210, and the metal oxide layer 221 is then formed on the metal layer 222 using a metal oxide material such as ITO. Thus, the organic light-emitting display device according to the current embodiment of the present invention can be used as a top emission type organic light-emitting display device in which images are displayed in an opposite direction to the substrate 210.

Referring to FIG. 13, a conductive material forming the source and drain electrodes is deposited on the substrate 210, the ohmic contact layer 250, and the pixel electrode 230, and is then patterned using a mask M3' to form the first and second electrodes 261 and 262 serving as source and drain electrodes.

The first electrode 261 is connected to the first region 241 of the semiconductor layer 240 via the ohmic contact layer 250. The second electrode 262 is connected to the second region 243 of the semiconductor layer 240 and the pixel electrode 230 via the ohmic contact layer 250. Although not shown, the first and second electrodes 261 and 262 are connected to data lines (not shown) applying data signals.

Figure 14:
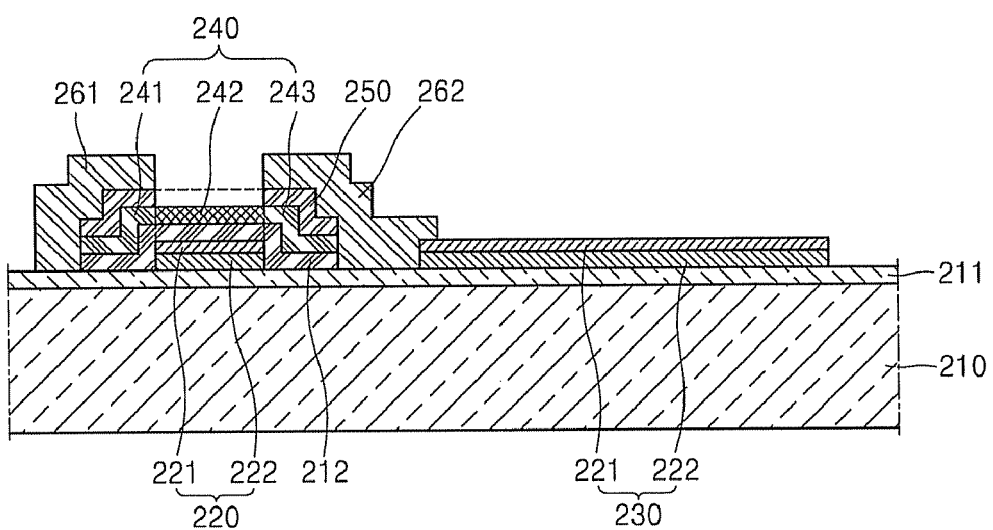

Referring to FIG. 14, after forming the first and second electrodes 261 and 262, the portion of the ohmic contact layer 250 exposed between the first and second electrodes 261 and 262 is removed by etching. The etching may be dry etching such as, for example, plasma etching, reactive ion etching (RIE), reactive sputter etching, reactive ion-beam milling, etc.

Figure 15:
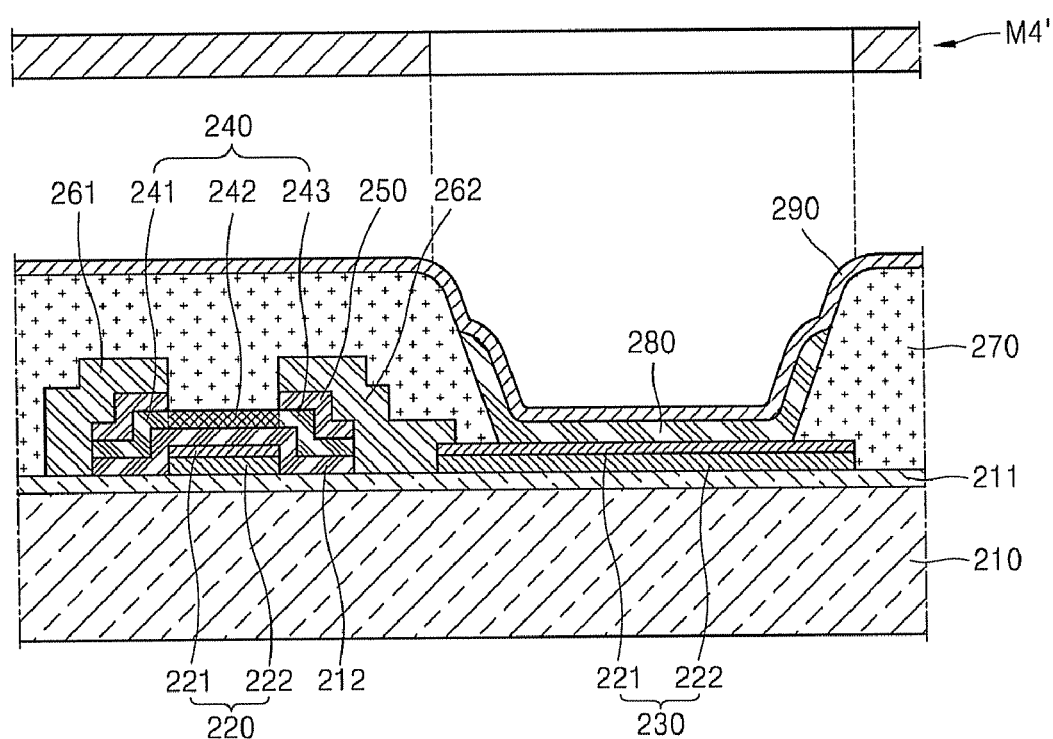

Referring to FIG. 15, a material to form a pixel defining layer 270 is deposited on the resultant structure of FIG. 14, and is then patterned using a mask M4' to form the pixel defining layer 270. An organic light-emitting layer 280 is formed on the resultant structure. A material and a formation method for the organic light-emitting layer 280 are as described above, and thus, a detailed description thereof will be omitted.

An opposite electrode 290 serving as a common electrode is formed on the organic light-emitting layer 280. In the organic light-emitting display device according to the current embodiment of the present invention, the pixel electrode 230 is an anode and the opposite electrode 290 is a cathode. Alternatively, the pixel electrode 230 may be a cathode and the opposite electrode 290 may be an anode.

In a top emission type organic light-emitting display device in which images are displayed in an opposite direction to the substrate 210, the pixel electrode 230 serves as a reflective electrode and the opposite electrode 290 serves as a transparent electrode. Here, the reflective electrode for the pixel electrode 230 may be formed as described above by depositing a metal oxide material with a high work function such as ITO, IZO, ZnO, or $In_2O_3$ on a reflective layer formed of Mo, Cr, Ti, Ag, Mg, Al, Pt, Pd, Au, Ni, Nd, Ir, Li, Ca, or a compound thereof. The transparent electrode for the opposite electrode 290 may be formed by depositing a metal with a low work function, i.e., Ag, Mg, Al, Pt, Pd, Au, Ni, Nd, Ir, Cr, Li, Ca, or a compound thereof and forming an auxiliary electrode layer or a bus electrode line thereon using a transparent conductive material such as ITO, IZO, ZnO, or $In_2O_3$.

A sealing member (not shown) and a hydroscopic agent (not shown) may be further provided on the opposite electrode 290 to protect the organic light-emitting layer 280 from external moisture or oxygen.

In the above-described organic light-emitting display device according to the current embodiment of the present invention, a metal layer and a metal oxide layer are sequentially deposited and patterned to simultaneously form a gate electrode and a pixel electrode, and a metal oxide layer of the pixel electrode is exposed simultaneously with patterning a semiconductor layer, thus significantly reducing the number of mask processes.

Thus, according to aspects of the present invention, a gate electrode and a pixel electrode are patterned at the same time, thus reducing the number of mask processes used in forming the organic light-emitting display device. Further, in a bottom emission type organic light-emitting display device, a reduction in display quality due to dark spots generated by an IR drop across a common electrode serving as a cathode can be avoided.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light-emitting display device comprising:
    a substrate;
    a gate electrode disposed on the substrate, the gate electrode comprising a metal oxide layer and a metal layer disposed between the metal oxide layer and the substrate;

a pixel electrode disposed on the substrate so as to be insulated from the gate electrode, the pixel electrode comprising a metal oxide layer and a metal layer disposed between the metal oxide layer and the substrate;

a gate insulating layer disposed on the substrate to cover the gate electrode;

a semiconductor layer disposed on the gate insulating layer, the semiconductor layer comprising a channel region corresponding to the gate electrode, and first and second regions disposed outside the channel region;

a first electrode connected to the first region of the semiconductor layer;

a second electrode connected to the second region of the semiconductor layer and the pixel electrode;

an ohmic contact layer disposed between the first region of the semiconductor layer and the first electrode and between the second region of the semiconductor layer and the second electrode;

a pixel defining layer disposed on the substrate to cover the first electrode, the second electrode, the semiconductor layer, and the pixel electrode, the pixel defining layer comprising an opening through which the pixel electrode is partially exposed;

an organic light-emitting layer disposed on a portion of the pixel electrode exposed through the opening; and an opposite electrode covering the organic light-emitting layer.

2. The organic light-emitting display device of claim 1, wherein the metal oxide layer comprises at least one metal oxide material selected from the group consisting of ITO, IZO, ZnO, and $In_2O_3$.

3. The organic light-emitting display device of claim 1, wherein the metal layer comprises at least one metal material selected from the group consisting of Mo, Cr, Ti, Ag, Mg, Al, Pt, Pd, Au, Ni, Nd, Ir, Li, Ca, and compounds thereof.

4. The organic light-emitting display device of claim 1, wherein the semiconductor layer comprises a polycrystalline silicon layer.

5. The organic light-emitting display device of claim 1, wherein ends of the gate insulating layer, the semiconductor layer, and the ohmic contact layer have the same pattern.

6. The organic light-emitting display device of claim 1, further comprising a buffer layer on the substrate.

7. The organic light-emitting display device of claim 1, wherein a portion of the pixel defining layer is between the pixel electrode and the light-emitting layer at a peripheral portion of the pixel electrode and the light-emitting layer.

8. The organic light-emitting display device of claim 1, wherein a distance between the pixel electrode and the opposite electrode is greater at a peripheral portion of the pixel electrode than at a center portion of the pixel electrode.

* * * * *